United States Patent
Feng et al.

(10) Patent No.: US 10,475,648 B1
(45) Date of Patent: Nov. 12, 2019

(54) METHOD FOR PATTERNING A SEMICONDUCTOR STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Wei Feng, Kaohsiung (TW); Ming-Te Wei, Changhua County (TW); Yu-Chieh Lin, Kaohsiung (TW); Ying-Chiao Wang, Changhua County (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/968,680

(22) Filed: May 1, 2018

(51) Int. Cl.
| H01L 21/033 | (2006.01) |
| H01L 21/02 | (2006.01) |
| H01L 27/108 | (2006.01) |
| H01L 21/027 | (2006.01) |
| H01L 21/3105 | (2006.01) |
| H01L 21/311 | (2006.01) |

(52) U.S. Cl.
CPC ...... *H01L 21/0337* (2013.01); *H01L 21/0217* (2013.01); *H01L 21/0271* (2013.01); *H01L 21/31058* (2013.01); *H01L 27/10894* (2013.01); *H01L 21/02164* (2013.01); *H01L 21/31111* (2013.01); *H01L 21/31133* (2013.01); *H01L 27/10897* (2013.01)

(58) Field of Classification Search
CPC ............ H01L 21/0337; H01L 21/0217; H01L 21/02164; H01L 21/0271; H01L 27/10894
See application file for complete search history.

(56) References Cited

U.S. PATENT DOCUMENTS

| | | | |
|---|---|---|---|
| 5,429,988 A | 7/1995 | Huang | |
| 7,037,840 B2 * | 5/2006 | Katz | H01L 21/31053 257/E21.244 |
| 7,615,496 B2 * | 11/2009 | Lee | H01L 21/0337 438/736 |
| 8,026,044 B2 * | 9/2011 | Lee | H01L 21/0337 430/270.1 |
| 8,247,302 B2 * | 8/2012 | Sills | G03F 7/0035 438/312 |
| 8,455,341 B2 * | 6/2013 | Russell | G03F 7/0035 438/585 |
| 8,969,206 B1 * | 3/2015 | Sel | H01L 21/32139 216/46 |
| 9,123,659 B1 | 9/2015 | Fu | |
| 9,673,049 B2 * | 6/2017 | Liou | H01L 21/3086 |
| 10,141,316 B2 * | 11/2018 | Lee | H01L 27/10855 |
| 10,153,165 B1 * | 12/2018 | Chang | H01L 21/32139 |
| 10,249,629 B1 * | 4/2019 | Chen | H01L 27/10823 |
| 2003/0153135 A1 * | 8/2003 | Kim | H01L 23/5258 438/132 |

(Continued)

*Primary Examiner* — Sophia T Nguyen
(74) *Attorney, Agent, or Firm* — Winston Hu

(57) ABSTRACT

A method for patterning a semiconductor structure is provided, including forming an additional third material layer on a thinner portion of a second material layer to be an etching buffer layer. The removed thickness of the thinner portion of the second material layer covered by the third material layer during an etching back process is therefore reduced.

10 Claims, 8 Drawing Sheets

A-A'  B-B'

(56) References Cited

U.S. PATENT DOCUMENTS

| | | | | |
|---|---|---|---|---|
| 2005/0142497 A1* | 6/2005 | Ryou | H01L 21/0337 | 430/311 |
| 2007/0013070 A1* | 1/2007 | Liang | H01L 21/3185 | 257/758 |
| 2007/0063247 A1* | 3/2007 | Jon | H01L 27/10852 | 257/308 |
| 2007/0148968 A1* | 6/2007 | Kwon | H01L 21/0337 | 438/671 |
| 2007/0238299 A1* | 10/2007 | Niroomand | H01L 21/0338 | 438/700 |
| 2007/0264828 A1* | 11/2007 | Jung | H01L 21/0337 | 438/692 |
| 2007/0287299 A1* | 12/2007 | Lee | H01L 21/0337 | 438/761 |
| 2008/0113511 A1* | 5/2008 | Park | H01L 21/0337 | 438/692 |
| 2008/0191288 A1* | 8/2008 | Kwon | H01L 27/10876 | 257/383 |
| 2008/0200026 A1* | 8/2008 | Koh | H01L 21/0337 | 438/643 |
| 2008/0261349 A1* | 10/2008 | Abatchev | H01L 21/0337 | 438/106 |
| 2008/0305636 A1* | 12/2008 | Kim | H01L 21/0337 | 438/696 |
| 2009/0117739 A1* | 5/2009 | Shin | H01L 21/0334 | 438/690 |
| 2009/0170318 A1* | 7/2009 | Choi | H01L 21/0337 | 438/692 |
| 2009/0317748 A1* | 12/2009 | Choi | G03F 7/095 | 430/312 |
| 2010/0130016 A1* | 5/2010 | DeVilliers | H01L 21/0273 | 438/703 |
| 2011/0133283 A1* | 6/2011 | Park | H01L 21/82345 | 257/368 |
| 2012/0205750 A1* | 8/2012 | Sudo | H01L 21/0337 | 257/379 |
| 2013/0337652 A1* | 12/2013 | Sun | H01L 21/0337 | 438/703 |
| 2014/0374809 A1* | 12/2014 | Park | H01L 27/1085 | 257/296 |
| 2017/0200616 A1* | 7/2017 | Min | H01L 21/0337 | |
| 2018/0190538 A1* | 7/2018 | Chu | H01L 21/76229 | |
| 2019/0013201 A1* | 1/2019 | Chang | H01L 27/10855 | |
| 2019/0035631 A1* | 1/2019 | Chang | H01L 21/0338 | |
| 2019/0181014 A1* | 6/2019 | Chang | H01L 21/3086 | |

* cited by examiner

METHOD FOR PATTERNING A SEMICONDUCTOR STRUCTURE

BACKGROUND OF THE INVENTION

1. Field of the Invention

The invention relates to semiconductor manufacturing, and more particularly to a method for patterning a semiconductor structure.

2. Description of the Prior Art

Dynamic random access memory (DRAM) is one kind of volatile memory. A DRAM device usually includes an array region comprising plural memory cells and a peripheral region comprising control circuit. The control circuits in the peripheral region may address each of the memory cells in the array region by plural columns of word lines and plural rows of bit lines traversing the array region and electrically connected to each of the memory cells to perform reading, writing or erasing data. In advanced semiconductor manufacturing, the chip size of a DRAM device may be dramatically scaled down by adopting a buried word-line or a buried bit-lines structure, allowing the active areas of the memory cells being arranged at a dense pitch.

In advanced semiconductor manufacturing, multiple patterning technologies are widely adopted for forming target patterns having delicate dimensions and dense pitches. In a typical multiple patterning process, the target layout pattern is decomposed into several component layout patterns. The component layout patterns are then respectively printed onto a set of photo masks. By performing multiple patterning processes, such as photolithography-etching processes, the component layout patterns are sequentially transferred from the photo masks to a semiconductor substrate in an overlapping manner thereby collectively reproducing the target pattern on semiconductor substrate.

Multiple patterning technologies including self-aligned-double-patterning (SADP) processes Or sidewall-image-transfer (SIT) processes are the most popular approaches for forming dense array patterns. The main advantage of an SADP process is that it is able to form dense patterns having a small pitch beyond the resolution limit of the photolithography process. During a SADP process, a first patterning process is carried out to form plural mandrel structures on a semiconductor substrate. The mandrel structures are arranged in a pitch twice of that of the array pattern to be formed. Spacers having etching selectivity with respect to the mandrel structures are then formed on sidewalls of the mandrel structures. After forming the spacers, a material layer is formed filling up the remaining spaces between the mandrel structures. The spacers are then removed, leaving the mandrel structures and the material layer on the semiconductor substrate. An etching mask process is then performed, using the mandrel structures and the material layer as an etching mask to etch away the semiconductor substrate not covered by the mandrel structures and the material layer, thereby transferring the pattern defined by the mandrel structures and the material layer to the semiconductor substrate to define a partial array pattern in the semiconductor substrate. Because the spacers between the mandrel structures and the material layer are self-aligned to the sidewalls of the mandrel structures, the partial array pattern substantially has half of the pitch of the mandrel structures, i.e. the pitch of the target array pattern to be formed. Subsequently, one or more patterning processes are performed on the semiconductor substrate to cut or remove some portions of the partial array pattern, thus producing the target array pattern on the semiconductor substrate. Compared with the mandrel structures, the target array pattern has a doubled pattern density.

However, some difficulties have been encountered when applying the SADP process to form the array pattern of a DRAM device because the dramatic pattern density differences between the array region and the peripheral region may cause a loading effect to the SADP process, making it difficult to control the thickness and uniformity of the material layer used in the SADP process, which may cause deformation of patterns due to insufficient thickness of the material layer or unexpected patterns and residues due to too much thickness of the material layer. These problems are still need to be overcome.

SUMMARY OF THE INVENTION

It is one objective of the present invention to provide a method for patterning a semiconductor structure which is able to improve the loading effect caused by pattern density difference between a dense pattern region and a sparse pattern region (such as an array region and a peripheral region of a DRAM device) in an SADP process.

According to one embodiment of the present invention, a method for patterning a semiconductor structure is provided. A substrate having an array region and a peripheral region is provided. A hard mask layer is formed on the substrate. A first material layer is formed on the hard mask layer. The first material layer is patterned to form a plurality of first material structures on the array region wherein the first material layer on the peripheral region is completely removed. A sacrificial layer is formed on sidewalls of the first material structures. A second material layer is formed on the substrate and completely covering the array region and the peripheral region. A third material layer is formed on the second material layer on the peripheral region. An etching back process is performed to remove a portion of the second material layer on the array region and at least a portion of the third material layer on the peripheral region until the sacrificial layer is exposed. The sacrificial layer is removed to form a plurality of spaces between the second material layer and the first material structures. The hard mask layer is patterned by being etched through the spaces between the second material layer and the first material structures.

According to another embodiment of the present invention, a method for patterning a semiconductor structure is provided. A substrate having an array region and a peripheral region is provided. A hard mask layer is formed on the substrate. A first material layer is formed on the hard mask layer. The first material layer on the array region is patterned to form a plurality of first material structures, wherein the first material layer on the peripheral region is not patterned and completely covers the peripheral region. A sacrificial layer is formed on sidewalls of the first material structures and a sidewall of the first material layer along a boundary between the array region and the peripheral region. A second material layer is formed on the sacrificial layer and completely covers the array region and the peripheral region. A third material layer is formed on the second material layer on the array region. An etching back process is performed to completely remove the third material layer and a portion of the second material layer until the sacrificial layer is exposed. The sacrificial layer is removed to forma plurality of first spaces between the second material layer and the first material structures and a second space along the boundary between the array region and the peripheral region. The hard mask layer is patterned by being etched through the first spaces and the second space.

After patterning the hard mask layer on the array region, another patterning process may be carried out to pattern the hard mask layer on the peripheral region and also pattern the partially patterned hard mask layer on the array region thereby obtaining a completely patterned hard mask layer. Afterward, the substrate may be etched using the completely patterned hard mask layer as an etching mask to form the target array pattern and the peripheral pattern in the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
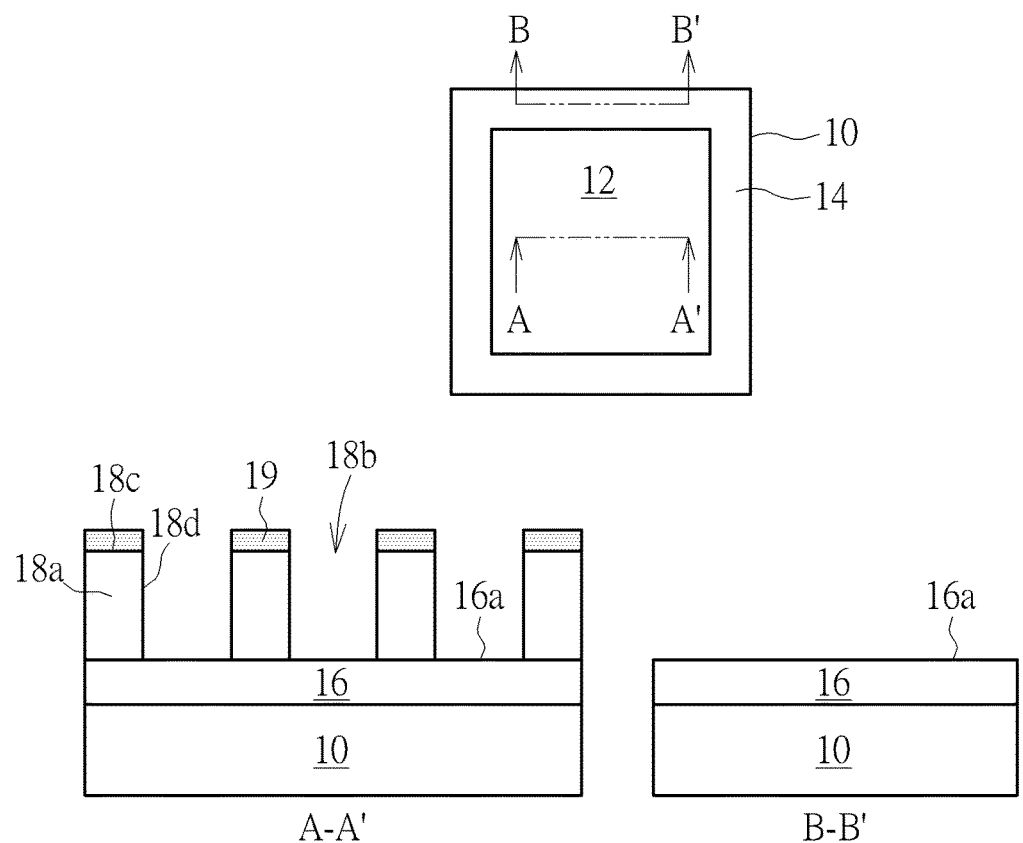
FIG. 1 to FIG. 7 are schematic diagrams illustrating the process of patterning a semiconductor structure according to a first embodiment of the present invention.
Figure 2:
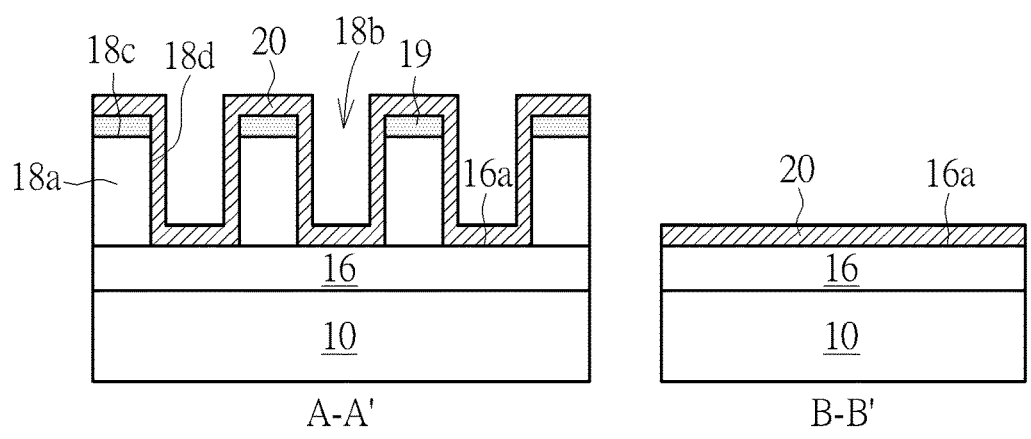
Figure 3:
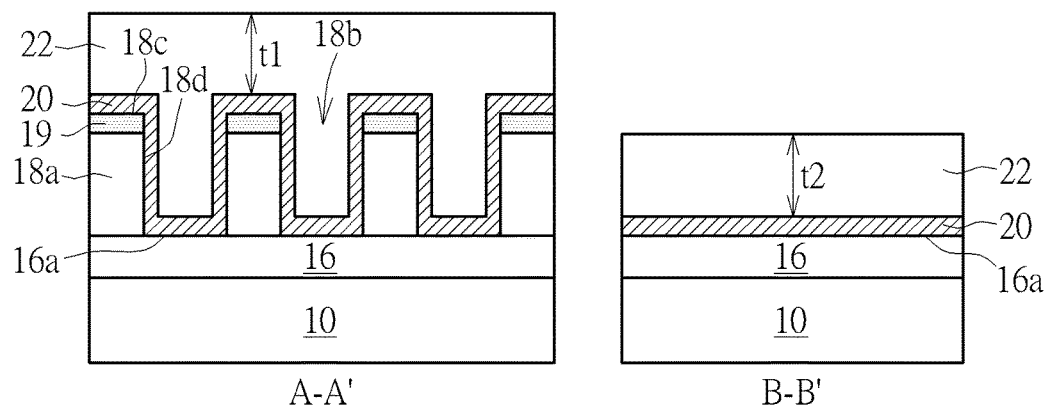
Figure 4:
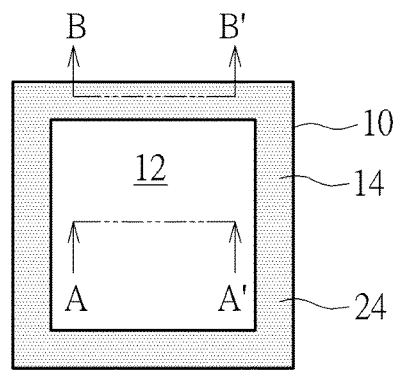
Figure 4:
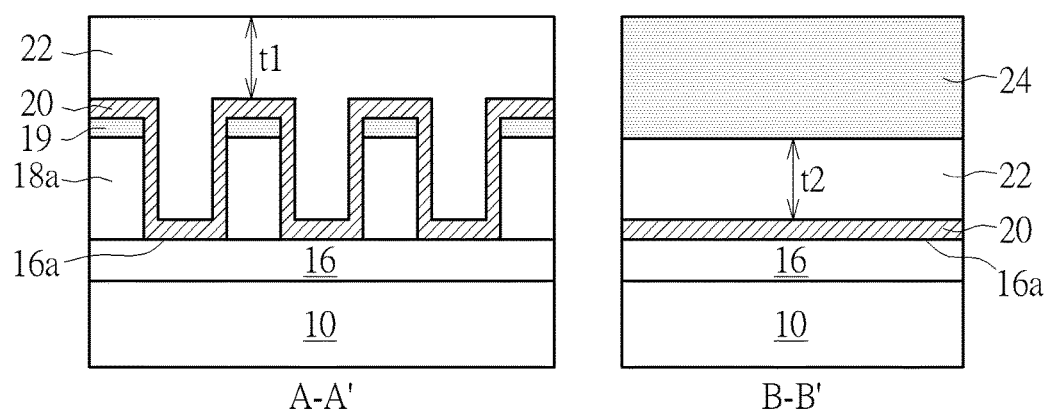

FIG. 1 to FIG. 7 illustrate the steps for patterning a semiconductor structure according to a first embodiment of the present invention. The upper portions of FIG. 1 and FIG. 4 are top views of the semiconductor structure. The lower portions of FIG. 1 and FIG. 4 are cross-sectional views of the semiconductor structure along line A-A' in the array region 12 and line B-B' in the peripheral region 14 as shown in the top views. FIG. 2, FIG. 3, FIG. 5, FIG. 6 and FIG. 7 are cross-sectional views taken along line A-A' and line B-B' illustrating the cross-sectional structure of the semiconductor structures in different process steps.

Please refer to FIG. 1. A substrate 10 is provided. The substrate 10 includes a dense pattern region and a sparse pattern region adjacent to the dense pattern region, such as an array region 12 and a peripheral region 14 of a DRAM device. The top view shown in FIG. 1 is an exemplary arrangement of the array region 12 and the peripheral region 14, which is provided for the sake of illustration and should not be taken as a limitation. It should be understood that the method provided by the present invention may be applied to form other semiconductor devices including other arrangement.

The substrate 10 may be a silicon substrate, an epitaxial substrate, a silicon germanium substrate, a silicon carbide substrate, or a silicon-on-insulator (SOI) substrate, but not limited thereto. The substrate 10 may have a single layered structure or a multi-layered structure. A hard mask layer 16 is formed on the substrate 10 and completely covering the array region 12 and the peripheral region 14. The hard mask layer 16 may have a single-layered structure or a multi-layered structure and may include a silicon oxide layer, a silicon nitride layer, an amorphous carbon based advanced patterning film (APF), or any a suitable material having etching selectivity with respect to the substrate 10 to be the etching mask when etching the substrate 10 in subsequent processes. A first material layer 18 (not shown) is then formed on the hard mask layer 16. The material of the first material layer 18 has an etching selectivity with respect to the hard mask layer 16. For example, the first material layer 18 may be an organic dielectric layer (ODL) which may be formed and self-leveled on the substrate 10 by its fluidity and then be cured to have an expected hardness to be an etching mask for etching the hard mask layer 16. Optionally, an anti-reflection coating layer 19 may be formed on the first material layer 18. According to an embodiment, the anti-reflection coating layer 19 may be a silicon-containing hard-mask bottom anti-reflection coating layer. Subsequently, the first material layer 18 on the array region 12 is patterned into a plurality of first material structures 18a, while the first material layer 18 on the peripheral region 14 is completely removed. According to an embodiment, the first material structures 18a are parallel with each other and spaced apart from each other by the spaces 18b. A portion of the hard mask layer 16 on the array region 12 is exposed from the spaces 18b. The hard mask layer 16 on the peripheral region 14 is completely exposed since the first material layer 18 on the peripheral region 14 is completely removed. The first material structure 18a has a sidewall 18d and a top surface 18c.

Please refer to FIG. 2. Subsequently, a sacrificial layer 20 is formed on the substrate 10 and at least covering the sidewalls 18d of the first material structures 18a. According to an embodiment, the sacrificial layer 20 is formed by anatomic layer deposition (ALD) process to be able to uniformly and conformally cover the sidewalls 18d and top surfaces 18c of the first material structures 18a and the top surface 16a of the hard mask layer 16. The material of the sacrificial layer 20 may include silicon oxide, silicon nitride or other materials having an etching selectivity with respective to the first material structures 18a.

Please refer to FIG. 3. Subsequently, a second material layer 22 is formed on sacrificial layer 20 and completely covering the array region 12 and the peripheral region 14. According to an embodiment, the second material layer 12 is an organic dielectric layer (ODL) which may be able to completely cover the substrate 10 and completely fill up the spaces 18b between the first material structures 18a by its fluidity and then be cured to have an expected hardness to be an etching mask for etching the hard mask layer 16. It is noteworthy that because the first material structures 18a are only formed on the array region 12 and the first material layer 18 on the peripheral region 14 has been completely removed, the array region 12 substantially has a pattern density of the first material structures 18a much higher than that of the peripheral region 14. The pattern density difference may cause a loading effect with respect to the coverage of the second material layer 22. Consequently, the second material layer 22 covering on the top surface 18c of the first material structures 18a on the array region 12 may have a thickness t1 larger than a thickness t2 of the second material layer 22 covering on the top surface 16a of the sacrificial layer 16 on the peripheral region 14. According to an embodiment, the thickness t1 may range from 1800 angstroms to 2000 angstroms, and the thickness t2 may be smaller than 1400 angstroms. The thickness t1 and the thickness t2 may differ by at least 400 angstroms.

Please refer to FIG. 4. Subsequently, a third material layer 24 is formed on the substrate 10 and covering the second material layer 22 on the peripheral region 14. As shown in the top view shown in the upper portion of FIG. 4, the third material layer 24 completely covers the peripheral region 14 without covering the array region 12. According to an embodiment, the third material layer 24 is preferably a photoresist layer that may be selectively formed on the second material layer 22 on the peripheral region 14 by simply performing a photolithography process. The third material layer 24 may have a smooth, integral top surface, without any pattern defined therein. According to an embodiment, the third material layer 24 is preferably made of materials having etching properties similar to the second material layer 22 and may be etched by the same etching process for etching the second material layer 22. For example, the third material layer 24 and the second material layer 22 may both include organic compounds, and may be removed by the same etching process in different removal rates. The third material layer 24 is an etching buffer layer for the underlying second material layer 22, preventing the second material layer 22 from being over-removed during the subsequent etching back process 30 (will be illustrated in following passages). The thickness of the third material layer 24 may vary according the difference between the thickness t1 and the thickness t2, and the difference between the removal rates of the third material layer 24 and the second material layer 22 in the etching back process 30. According to an embodiment, the third material layer 24 may have fluidity better than that of the first material layer 18 and the second material layer 22 for being able to better self-leveled on the substrate 10.

Figure 5:
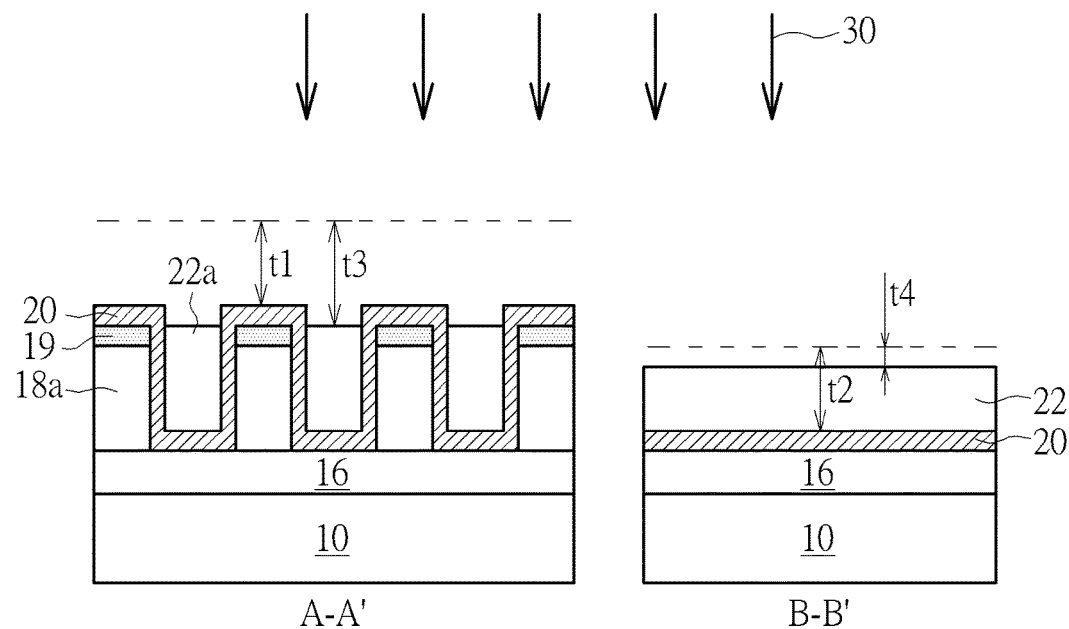

Please refer to FIG. 5. Subsequently, an etching back process 30 is performed on the entire substrate 10 to remove a thickness t3 of the second material layer 22 on the array region 12 to expose the sacrificial layer 20 on sidewalls of the first material structures 18a and define a plurality of second material structures 22a in the spaces 18b. The removed thickness t3 is equal to or larger than the thickness t1. It is noteworthy that the etching back process 30 also etches away at least a portion of the third material layer 24 on the peripheral region 14. According to an embodiment, as shown in the right portion of FIG. 5, the etching back process 30 completely removes the third material layer 24 and then removes the second material layer 22 under third material layer 24 by a thickness t4. It is one feature of the present invention that by selectively forming the third material layer 24 covering the thinner portion of the second material layer 22 (the second material layer 22 on the peripheral region 14), the etching of the second material layer 22 covered by the third material layer 24 is postponed until the third material layer 24 is completely removed. In other words, the second material layer 22 on the peripheral region 14 is etched for a time shorter than the second material layer 22 on the array region 12 during the etching back process 30. Therefore, the removed thickness t4 of the second material layer 22 on the peripheral region 14 is smaller than the removed thickness t3 of the second material layer 22 on the array region 12. In this way, the second material layer 22 on the array region 12 may be removed by a thickness t3 to expos the sacrificial layer 20 on sidewalls of the first material structures 18a without concerning the second material layer 22 on the peripheral region 14 being over-etched to a thickness not enough for being an etching mask layer against the subsequent hard mask etching process 40 (shown in FIG. 7). After the etching back process 30, as shown in FIG. 5, a sufficient thickness (t2-t4) of the second material layer 22 is remained on the peripheral region 14 and completely covering the sacrificial layer 20 and the hard mask layer 16. The remaining second material layer 22 on the peripheral region 14 may protect the underneath hard mask layer 16 from being damaged during the subsequent hard mask etching process. It should be understood that, in other embodiments, the third material layer 24 may not be completely removed by the etching back process 30. A portion of the third material layer 24 may remain on the second material layer 22 on the peripheral region 14 after the etching back process 30.

Figure 6:
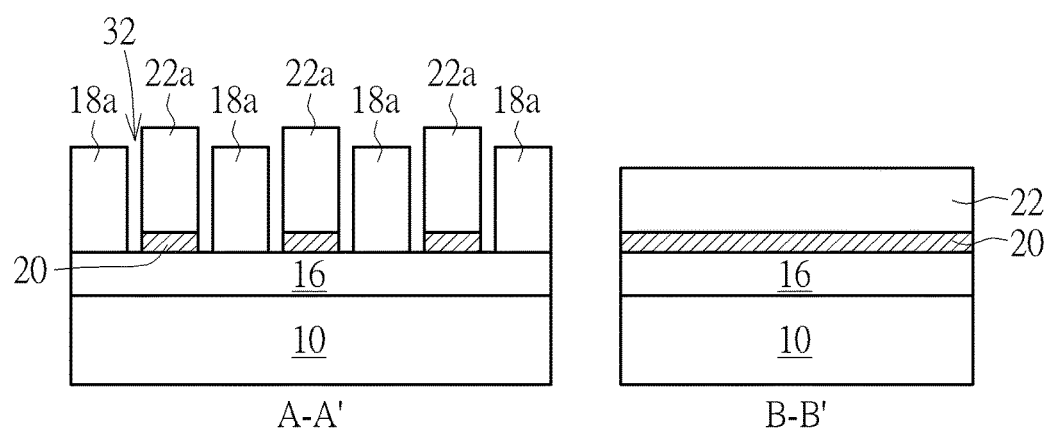

Please refer to FIG. 6. Subsequently, the exposed sacrificial layer 20 is removed to form a plurality of spaces 32 between the second material structures 22a and the first material structures 18a. A portion of the hard mask layer 16 is exposed from the spaces 32. According to an embodiment, the anti-reflection layer 19 on the top portion of the first material structure 18a is also removed. The sacrificial layer 20 on the peripheral region 14 is not removed for being covered by the second material layer 22.

Figure 7:
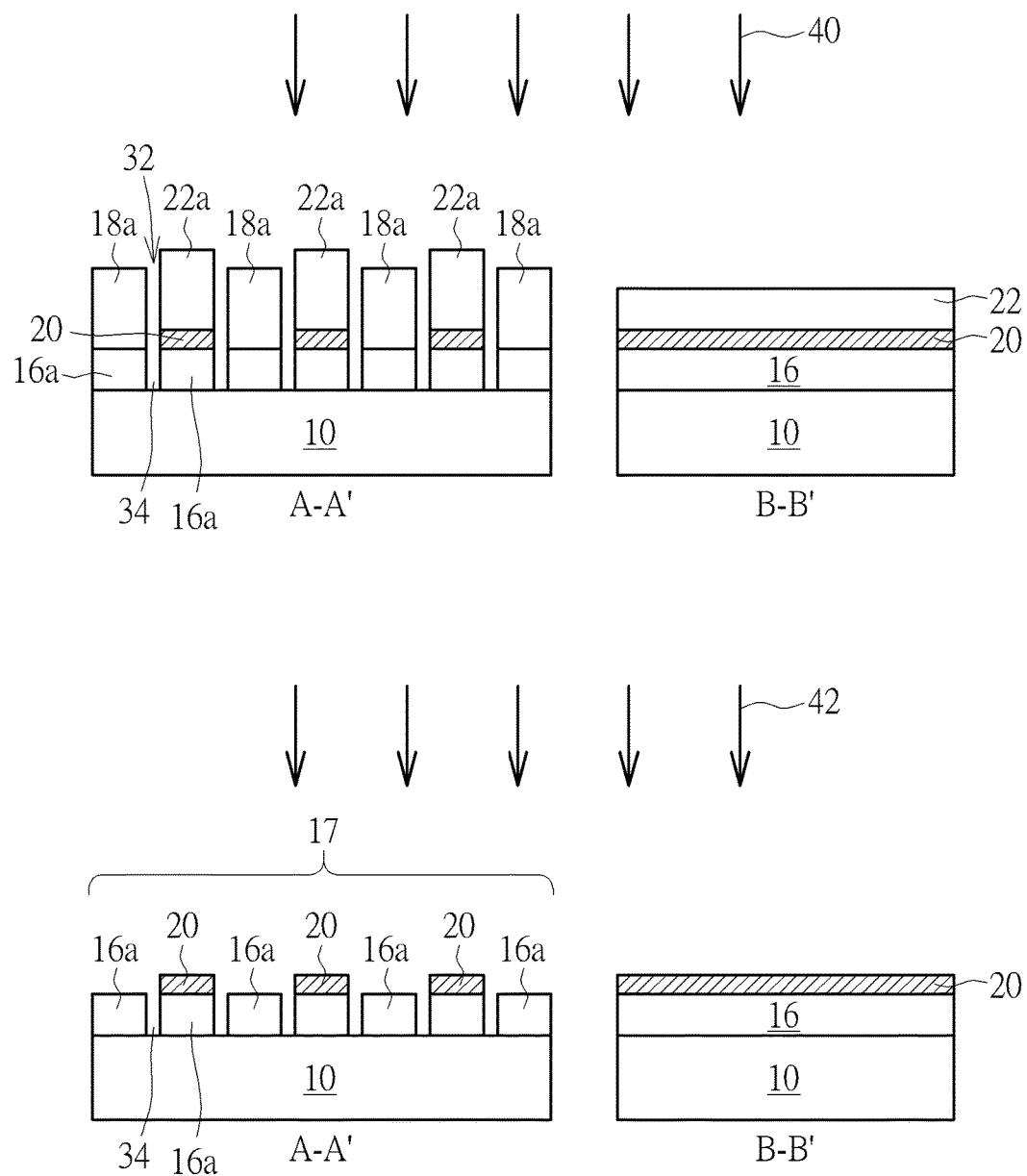

Please refer to the upper portion of FIG. 7. Subsequently, a hard mask etching process 40 is performed, using the first material structures 18a and the second material structures 22a as the etching mask to etch the exposed portion of the hard mask layer 16 thereby forming a plurality of spaces 34 in the hard mask layer 16. The pattern defined by the first material structures 18a and the second material structures 22a is therefore transferred into the hard mask layer 16 and becomes a partial array pattern 17 defined by the hard mask structures 16a. The hard mask layer 16 on the peripheral region 14 is not etched by the hard mask etching process 40 for being completely covered by the second material layer 22. At this point, the hard mask layer 16 on the peripheral region 14 remains its original shape without any pattern or etching marks formed therein.

Please refer to the lower portion of FIG. 7. Subsequently, a strip process 42 may be carried out to completely remove the first material structures 18a, the second material structures 22a on the array region 12 and the second material layer 22 on the peripheral region 14. After that, another patterning process (not shown) such as a conventional photolithography-etching process may be performed to pattern the hard mask layer 16 on the peripheral region 14 into a peripheral circuit pattern and also pattern the hard mask structures 16a on the array region 12 to transform the partial array pattern 17 into a complete array pattern. For example, by forming a plurality of cuts intersecting the hard mask structures 16a, the hard mask structures 16a may be divided into plural discrete segments. Afterwards, the substrate 10 is etched using the patterned hard mask layer 16 as an etching mask to transfer the complete array pattern and the peripheral circuit pattern from the patterned hard mask layer 16 to the substrate 10, thereby forming the target array pattern and the target peripheral pattern in the substrate 10.

Figure 8:
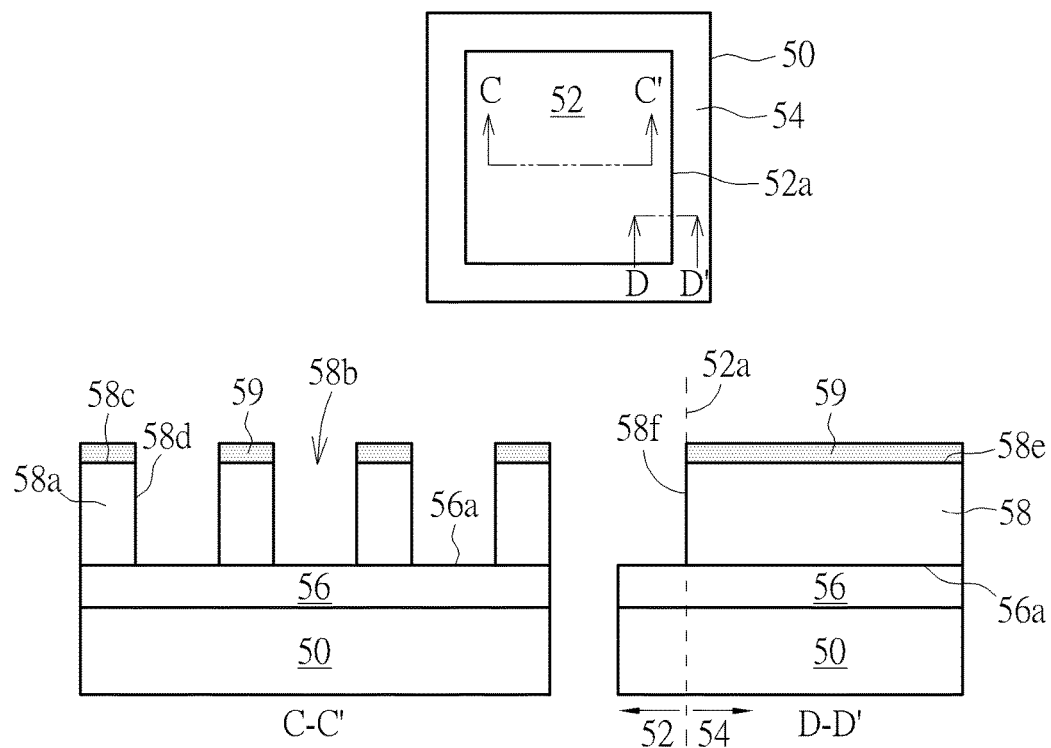
FIG. 8 to FIG. 14 are schematic diagrams illustrating the process of patterning a semiconductor structure according to a second embodiment of the present invention.
Figure 9:
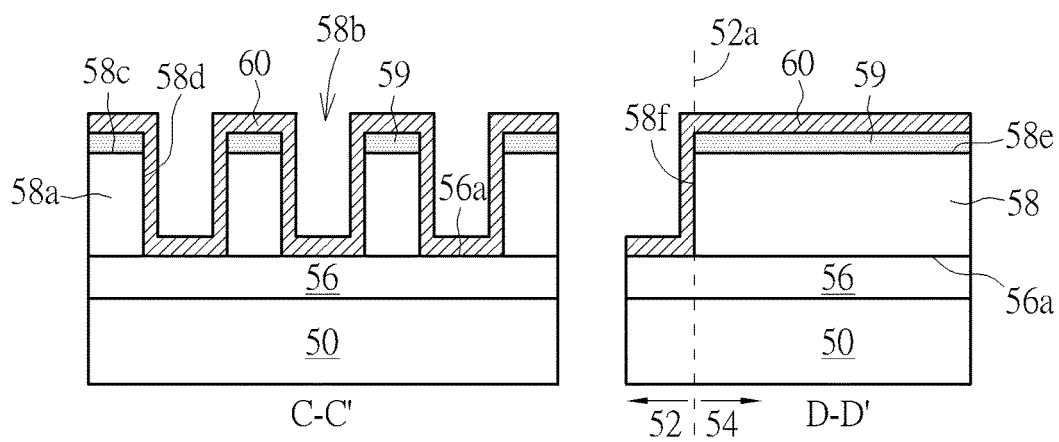
Figure 10:
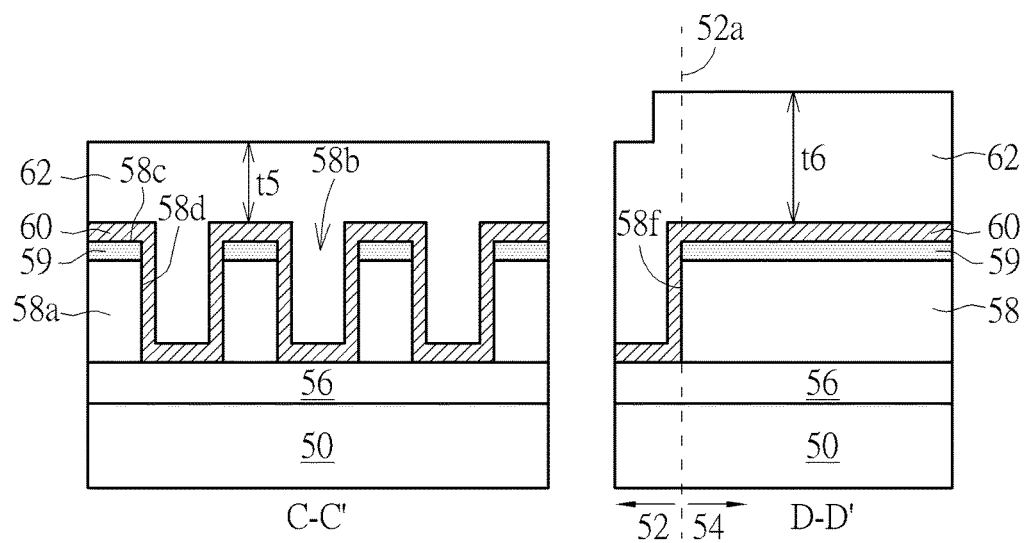
Figure 11:
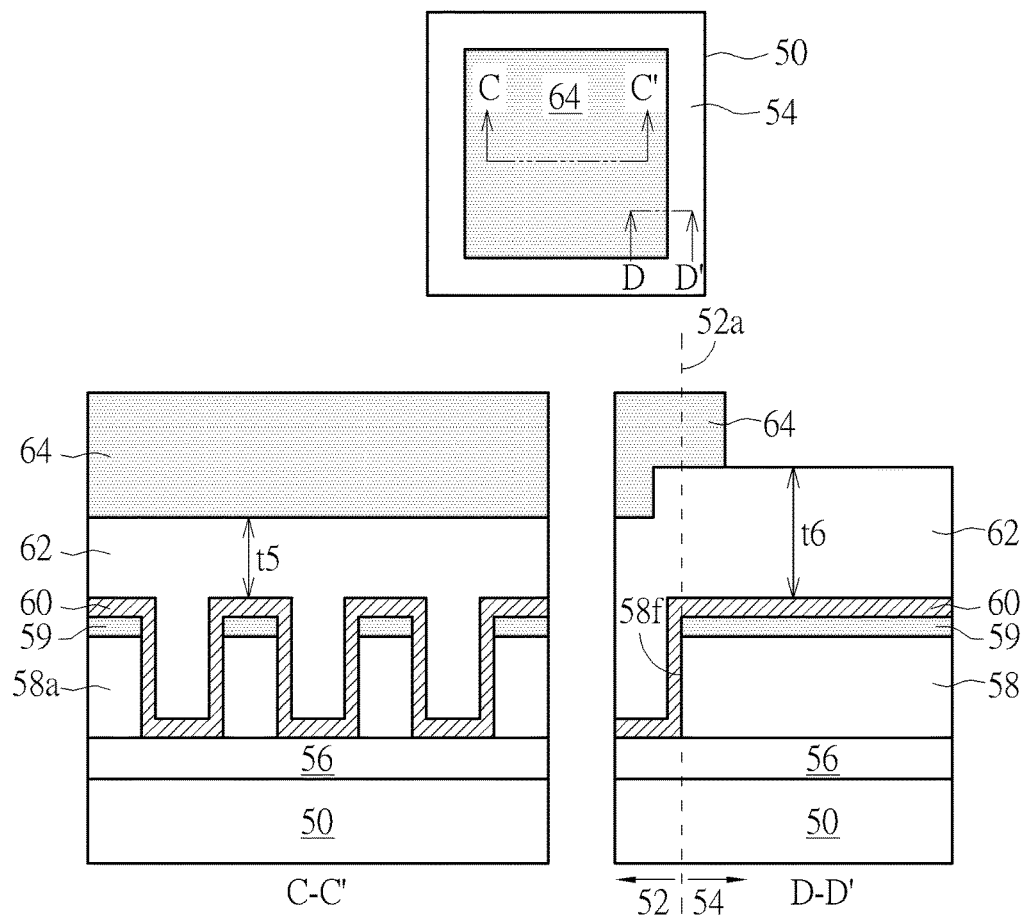

FIG. 8 to FIG. 14 illustrates the steps for patterning a semiconductor structure according to a second embodiment of the present invention. The upper portions of FIG. 8 and FIG. 11 are top views of the semiconductor structure. The lower portions of FIG. 8 and FIG. 11 are cross-sectional views of the semiconductor structure along line C-C' in the array region 52 and line D-D' across the boundary 52a between the array region 52 and the peripheral region 54 as shown in the top views. FIG. 9, FIG. 10, FIG. 12, FIG. 13 and FIG. 14 are cross-sectional views taken along line C-C' and line D-D' illustrating the cross-sectional structures of the semiconductor structure in different process steps. The materials used in the second embodiment are the same as in the first embodiment as shown in FIG. 1 to FIG. 7 and are not repeated in the following description. The difference between the first embodiment and the second embodiment is that, in the second embodiment, the first material on the peripheral region is not removed when forming the first material structures on the array region, and the third material layer is formed on the array region rather than on the peripheral region.

Please refer to FIG. 8. Similarly, a substrate 50 is provided. The substrate 10 has an array region 52 and a peripheral region 52 adjacent to the array region 52. A hard mask layer 56 is formed on the substrate 50 and completely covering the array region 52 and the peripheral region 54. A first material layer 58 is formed on the hard mask layer 56. Optionally, an anti-reflection coating layer 59 may be formed on the first material layer 58. The first material layer 58 on the array region 52 is patterned to form a plurality of first material structures 58a defined by the spaces 58b. The first material structures 58a are parallel with each other and spaced apart from each other by the spaces 58b, and a portion of the hard mask layer 56 on the array region 52 is exposed from the spaces 58b. The first material layer 58 on the peripheral region 54 is not removed and retains its original shape completely covering on the hard mask layer 56 on the peripheral region 54. According to an embodiment, the first material layer 58 on the peripheral region 54 has a flat top surface 58e and a sidewall 58f along the boundary 52a between the array region 52 and the peripheral region 54.

Please refer to FIG. 9. Subsequently, a sacrificial layer 60 is formed on the substrate 50 and at least covering the sidewalls 58d of the first material structures 58a and the sidewall 58f of the first material layer 58. According to an embodiment, the sacrificial layer 60 is formed by atomic layer deposition (ALD) process to be able to uniformly and conformally cover the sidewalls 58d and top surfaces 58c of the first material structures 58a, the sidewall 58f and top surface 58e and the top surface 56a of the hard mask layer 56.

Please refer to FIG. 10. Subsequently, a second material layer 62 is formed on the sacrificial layer 60 and completely covering the array region 52 and the peripheral region 54. Because the first material layer 58 on the array region 52 is patterned into the first material structures 58a and the first material layer 58 on the peripheral region 54 remains as an integral bulk, the peripheral region 54 substantially has a pattern density of the first material layer much higher than that of the array region 52. The pattern density difference may cause a loading effect with respect to the coverage of the second material layer 62. Consequently, the second material layer 62 covering on the top surface 58e of the first material layer 58 on the peripheral region 54 may have a thickness t6 larger than a thickness t5 of the second material layer 62 covering on the top surface 58c of the first material structures 58a on the array region 52. According to an embodiment, the thickness t6 may range from 1800 angstroms to 2000 angstroms. The thickness t5 may be smaller than 1400 angstroms. The thickness t5 and the thickness t6 may differ by at least 400 angstroms.

Please refer to FIG. 11. Subsequently, a third material layer 64 is formed on the substrate 50 and covering the second material layer 62 on the array region 52. The third material layer 64 may be a photoresist layer and may be selectively formed on the second material layer 62 on the array region 52 by simply performing a photolithography process. The third material layer 64 may have a smooth, integral top surface, without any pattern defined therein. According to an embodiment, the third material layer 64 may have an edge aligned with the boundary 52a between the array region 52 and the peripheral region 54. According to another embodiment, as shown in FIG. 11, the third material layer 64 may extend laterally to overlap a portion of the second material layer 62 on the peripheral region 54 and may have an edge directly over the peripheral region 54 of the substrate 50. The third material layer 54 is an etching buffer layer for the underlying second material layer 62, preventing the second material layer 62 from being over-removed during the subsequent etching back process 70 (will be illustrated in following passages). The thickness of the third material layer 64 may vary according the difference between the thickness t5 and the thickness t6, and the difference between the removal rates of the third material layer 64 and the second material layer 62 in the etching back process 70.

Figure 12:
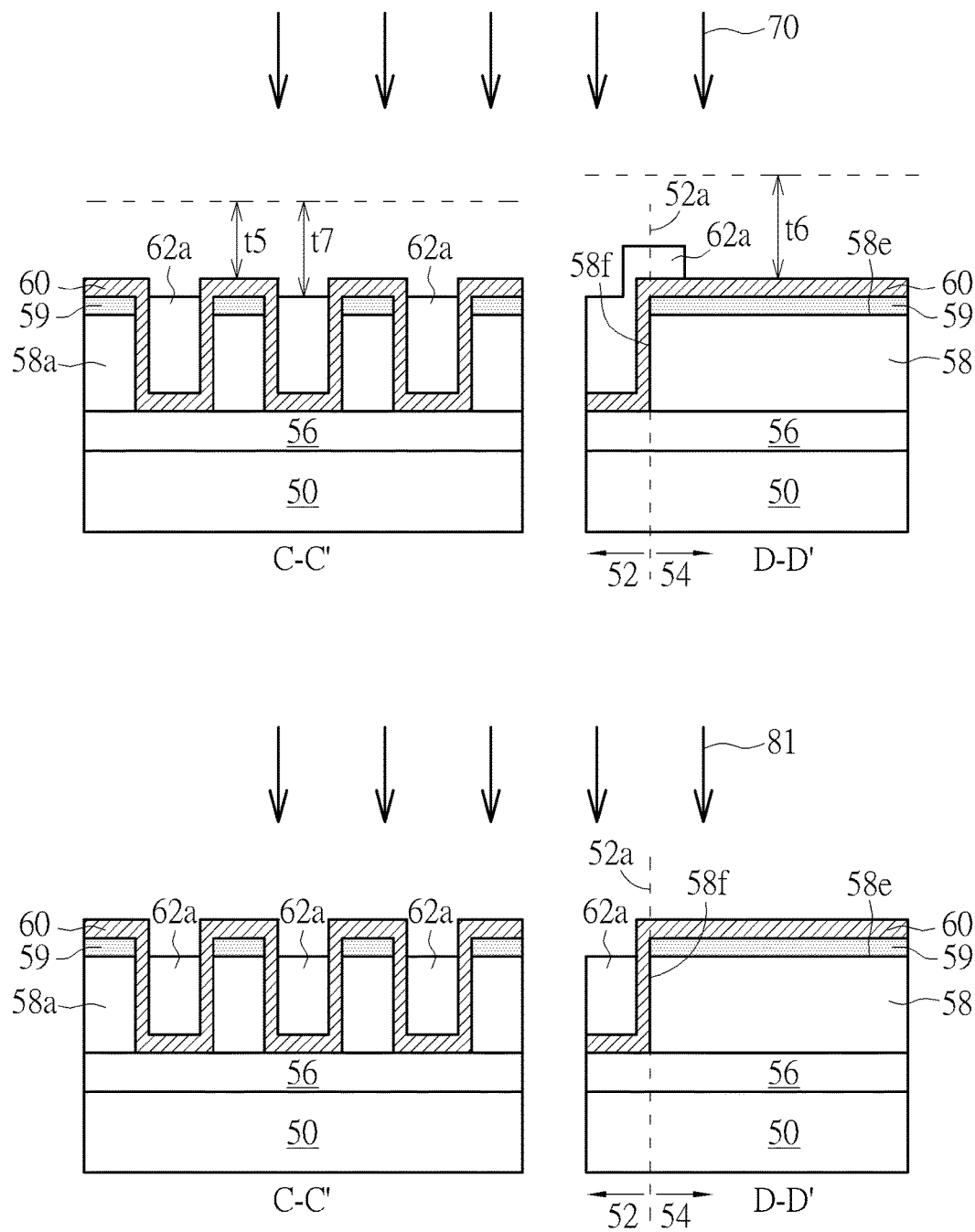

Please refer to FIG. 12. Subsequently, an etching back process 70 is performed on the entire substrate 50 to completely remove third material layer 64 on the array region 52 and then continuingly remove a thickness t7 of the second material layer 62 covered by the third material layer 64 to expose the sacrificial layer 60 on the top surfaces 58c of the first material structures 58a and define a plurality of second material structures 62a in the spaces 58. The removed thickness t7 is equal to or larger than the thickness t5. The second material layer 62 on the peripheral region 54 is also removed during the etching back process 70 to expose the sacrificial layer 60 on the top surface 58e and sidewall 58f of the first material layer 58 on the peripheral region 54. Optionally, as shown in the lower portion of FIG. 12, an descum process 81 may be performed after the etching back process 70 to further remove a portion of the second material layer 62 to make sure that the sacrificial layer 60 on the top surface 58e is completely exposed.

According to the illustrated embodiment, the third material layer 64 is formed on the thinner portion of the second material layer 62, that is, the second material layer 62 on the array region 52 to serve as an etching buffer layer for the second material layer 62. During the etching back process 70, the etching of the second material layer 62 covered by the third material layer 64 is postponed until the third material layer 64 is completely removed. The second material layer 62 on the array region 52 is substantially etched for a time shorter than the second material layer 62 on the peripheral region during the etching back process 70. Therefore, the removed thickness t7 of the second material layer 62 on the array region 52 is smaller than the removed thickness t6 of the second material layer 62 on the peripheral region 54. In this way, the second material layer 62 having the thickness t6 on the peripheral region 54 may be completely removed to expose the sacrificial layer 60 on the first material layer 58 without concerning the second material layer 62 on the array region 52 being over-etched to a thickness not enough for being an etching mask layer against the subsequent hard mask etching process 80 (shown in FIG. 13). The thickness of the third material layer 64 may vary according the difference between the thickness t5 and the thickness t6, and the difference between the removal rates of the third material layer 64 and the second material layer 62 in the etching back process 70. By controlling the thickness of the third material layer 64, the second material structures 62a filling in the spaces 58b may have a top surface flush with the top surface 58c of the first material structures 58a after the etching back process 70 or the descum process 81, as shown in FIG. 12.

Figure 13:
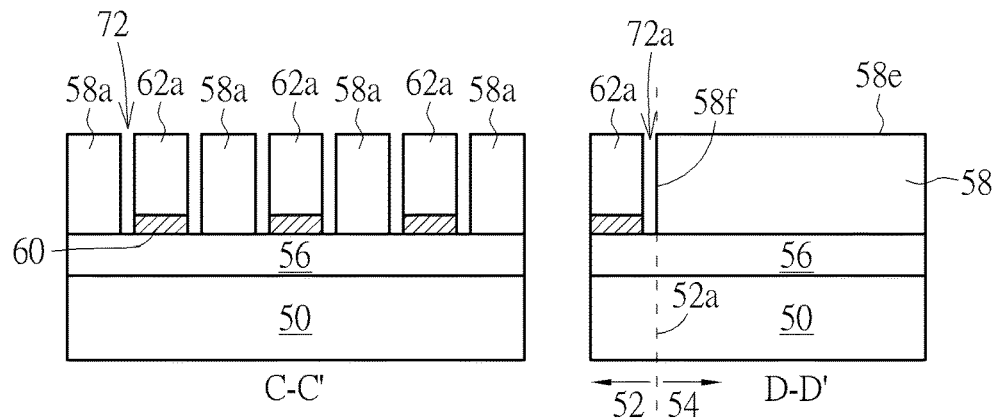

Please refer to FIG. 13. Subsequently, the exposed sacrificial layer 60 is removed to form a plurality of first spaces 72 between the second material structures 62a and the first material structures 58a and a second space 72a along the boundary 52a between the first material layer 58 and the second material structure 62a. The hard mask layer 56 is exposed from the first spaces 72 and the second space 72a. The sacrificial layer 60 on the top surface 58c of the first material structures 58a and the top surface 58e of the first material layer 58 is completely removed. According to an embodiment, the anti-reflection layer 59 on the top surfaces 58c of the first material structures 58a is also removed.

Figure 14:
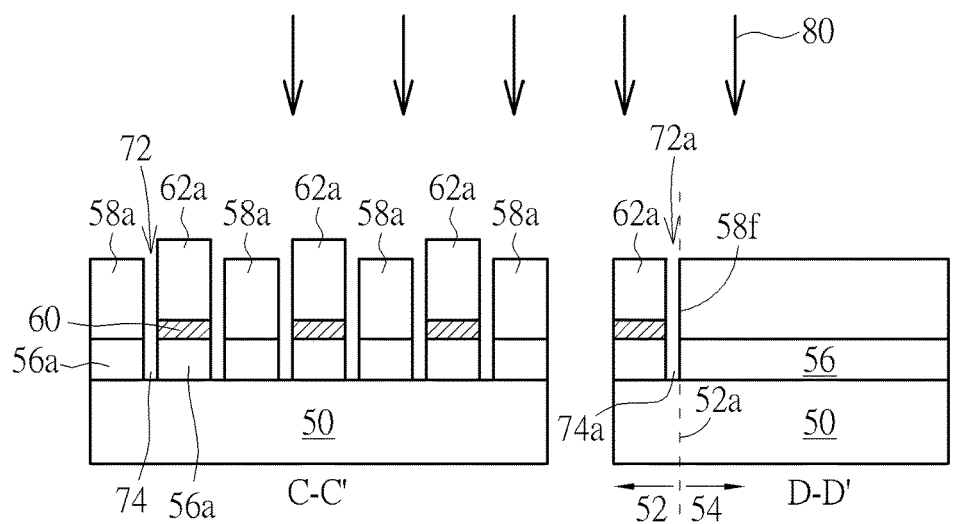

Please refer to the upper portion of FIG. 14. Subsequently, a hard mask etching process 80 is performed, using the first material structures 58a, the second material structures 62a and the first material layer 58 as an etching mask to etch the exposed hard mask layer 56, thereby forming spaces 74 and 74a in the hard mask layer 56. The pattern defined by the first material structures 58a and the second material structures 62a is therefore transferred into the hard mask layer 56 and becomes a partial array pattern 57 defined by the hard mask structures 56a. The hard mask layer 56 on the peripheral region 54 is not etched by the hard mask etching process 80 for being completely covered by the first material layer 58. At this point, the hard mask layer 56 on the peripheral region 54 remains its original shape without any pattern or etching marks.

Please refer to the lower portion of FIG. 14. Subsequently, a strip process 82 may be carried out to completely remove the first material structures 58a, the second material structures 62a on the array region 52 and the first material layer 58 on the peripheral region 54. Since the sacrificial layer 60 on the top surface 58e and sidewall 58f of the first material layer 58 is removed, all of the first material layer 58 on the peripheral region 54 may be removed by the strip step 82 without being masked by any residual sacrificial layer 60 and residuals of the first material layer 58 on the hard mask layer 56, which may cause pattern deformation or defect during the following patterning process, may be avoided. After completely removing the first material structures 58a, the second material structures 62a on the array region 52 and the first material layer 58, another patterning process (not shown) may be performed to pattern the hard mask layer 56 on the peripheral region 54 into a peripheral circuit pattern and also pattern the hard mask structures 56a on the array region 52 to transform the partial array pattern 57 into a complete array pattern. Afterwards, the substrate 50 is etched using the patterned hard mask layer 56 as an etching mask to transfer the complete array pattern and the peripheral circuit pattern from the patterned hard mask layer 56 to the substrate 50, thereby forming the target array pattern and the target peripheral pattern in the substrate 50.

The method provided by the present invention may overcome the problems caused by a loading effect of the SADP process. The method provided by the present invention makes SADP process applicable for patterning the array region without causing side effects to the peripheral region. By forming a third material layer overlapping on a thinner portion of the second material layer as an etching buffer layer to compensate the thickness variation of the second material layer, over-etching of the second material layer may be prevented. The first material layer and the second material layer used in an SADP process are preferably made of the same material, and the third material layer is preferably made of a material having etching property similar with the second material layer, allowing the third material layer and the second material layer to be removed by the same etching or strip process. Extra etching or strip processes to remove the third material layer may be omitted. The present invention is able to overcome the SADP loading effect problem by a simple and convenient method.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for patterning a semiconductor structure, comprising:
providing a substrate having an array region and a peripheral region;
forming a hard mask layer on the substrate;
forming a first material layer on the hard mask layer;
patterning the first material layer to form a plurality of first material structures on the array region and completely remove the first material layer on the peripheral region;
forming a sacrificial layer on sidewalls of the first material structures;
forming a second material layer completely covering the array region and the peripheral region;
forming a third material layer covering the second material layer on the peripheral region;
performing an etching back process to remove a portion of the second material layer on the array region and at least a portion of the third material layer on the peripheral region until the sacrificial layer is exposed;
removing the sacrificial layer to form a plurality of spaces between the second material layer and the first material structures; and
etching the hard mask layer through the spaces to pattern the hard mask layer.

2. The method according to claim 1, wherein whole of the third material layer and a portion of the second material layer on the peripheral region are removed after the etching back process.

3. The method according to claim 2, wherein the hard mask layer on the peripheral region is completely covered by a remaining portion of the second material layer after the etching back process.

4. The method according to claim 1, wherein a portion of the third material layer remains on the second material layer on the peripheral region after the etching back process.

5. The method according to claim 1, wherein the sacrificial layer further covers top surfaces of the first material structures.

6. The method according to claim 5, wherein the portion of the sacrificial layer on the top surfaces of the first material structures is completely exposed after the etching back process.

7. The method according to claim 1, further comprising a strip process to remove the first material structures and the second material layer after etching the hard mask layer.

8. The method according to claim 1, wherein the sacrificial layer comprises silicon nitride.

9. The method according to claim 1, wherein the first material layer and the second material layer are organic dielectric layers (ODL) and the third material layer is a photoresist layer.

10. The method according to claim 1, wherein a removed thickness of the second material layer on the array region is larger than a removed thickness of the second material layer on the peripheral region.

* * * * *